(12) United States Patent
Aoki

(10) Patent No.: US 8,293,070 B2
(45) Date of Patent: Oct. 23, 2012

(54) OXYGEN ION IMPLANTATION EQUIPMENT

(75) Inventor: Yoshiro Aoki, Tokyo (JP)

(73) Assignee: Sumco Corporation, Tokyo (JP)

( * ) Notice: Subject to any disclaimer, the term of this patent is extended or adjusted under 35 U.S.C. 154(b) by 743 days.

(21) Appl. No.: 12/402,584

(22) Filed: Mar. 12, 2009

(65) Prior Publication Data

US 2009/0260570 A1 Oct. 22, 2009

(30) Foreign Application Priority Data

Apr. 22, 2008 (JP) .................................. 2008-110807

(51) Int. Cl.
*C23C 16/00* (2006.01)
(52) U.S. Cl. ................................. 156/345.52
(58) Field of Classification Search .................. 118/725, 118/723 R; 156/345.52
See application file for complete search history.

(56) References Cited

U.S. PATENT DOCUMENTS

| | | | |
|---|---|---|---|
| 5,207,835 A * | 5/1993 | Moore ........................... | 118/725 |
| 5,930,643 A | 7/1999 | Sadana et al. | |
| 6,927,144 B2 * | 8/2005 | Izumi et al. ................... | 438/403 |
| 7,146,744 B2 * | 12/2006 | Kobayashi ........................ | 34/62 |
| 7,812,325 B2 * | 10/2010 | Buonodono et al. ...... | 250/492.21 |
| 2009/0260570 A1 * | 10/2009 | Aoki .......................... | 118/723 R |
| 2010/0197047 A1 * | 8/2010 | Ko .................................. | 438/5 |

* cited by examiner

*Primary Examiner* — Sylvia R. MacArthur
(74) *Attorney, Agent, or Firm* — Greenblum & Bernstein, P.L.C.

(57) ABSTRACT

In oxygen ion implantation equipment, a chamber has a bottom wall on one end face thereof and is open in the other end face thereof. A wafer holder rotatably holding a plurality of wafers on the same circumference of a circle is housed in the chamber. Inside a cap closing an opening of the chamber while making the chamber airtight with a sealing member, a coolant passage is formed near the sealing member. A plurality of lamp heaters are disposed so as to extend in the direction of the tangent to the circumference of the cap and align parallel to the direction of the radius of the cap, in such a way as to face one wafer held by the wafer holder. When the plurality of lamp heaters are divided into inner lamps located on the inner side of the cap in the direction of the radius thereof and outer lamps located on the outer side of the cap in the direction of the radius thereof, the amount of heat applied to the wafer per unit time by the outer lamps is made larger than the amount of heat applied to the wafer per unit time by the inner lamps.

6 Claims, 4 Drawing Sheets

OXYGEN ION IMPLANTATION EQUIPMENT

BACKGROUND OF THE INVENTION

1. Field of the Invention

The present invention relates to equipment for implanting oxygen ions into a wafer, and more particularly to oxygen ion implantation equipment that can improve the uniformity of the thickness of an SOI (silicon on insulator) layer of a SIMOX (Separation by IMplanted OXygen) wafer.

2. Description of the Related Art

Conventionally, in oxygen ion implantation equipment of this type, a wafer is heated by a lamp heater, and, as the lamp heater, 10 to 15 halogen lamps arranged at regular intervals are used to heat the whole surface of the wafer uniformly. The lamp heater is used at the time of oxygen ion implantation in the production process of a SIMOX wafer, and, at present, the commercially available SIMOX wafer is produced by a method called an MLD (modified low dose) method. In the MLD method, oxygen ion implantation is performed in two stages (for example, refer to Patent Document 1). First oxygen ion implantation is performed by heating a silicon wafer to 200 to 700° C., preferably to about 550 to 575° C., and then second oxygen ion implantation is performed by heating the silicon wafer to −269 to 300° C., preferably to about 25 to 200° C. The first oxygen ion implantation helps maintain the single-crystal surface of the silicon wafer by heating the silicon wafer, and forms a layer containing a high concentration of oxygen. In the second oxygen ion implantation, an amorphous layer is formed. Then, high-temperature heat treatment is performed with an oxygen/argon gas mixture, whereby an SOI structure is formed.

Patent Document 1

U.S. Pat. No. 5,930,643 (claims 1, 6, 7, 14, and 15)

SUMMARY OF THE INVENTION

In the above-described conventional two-stage ion implantation method disclosed in Patent Document 1, specific heating means is not described at all. Usually, by attaching a plurality of halogen lamps to a cap in such a way as to face the surface of a wafer placed in a chamber, the whole surface of the wafer can be heated uniformly. In this case, a ring-shaped coolant passage is formed inside the cap, such that an O-ring provided for making the chamber airtight can be cooled by passing a coolant through this passage. However, the coolant passing through the passage may cause a drop in temperature of a portion of the wafer which lies close to the passage, that is, a portion of the wafer which lies close to the side of the chamber, resulting in a nonuniform film thickness of an SOI layer of the wafer. Accordingly, an object of the present invention is to provide oxygen ion implantation equipment that can improve the uniformity of the thickness of an SOI layer of a SIMOX wafer.

A first aspect of the present invention is an improvement of oxygen ion implantation equipment provided with: a cylindrical chamber which has a bottom wall on one end face thereof and is open in the other end face thereof; a wafer holder housed in the chamber, the wafer holder rotatably holding a plurality of wafers on the same circumference of a circle; a disk-shaped cap closing an opening of the chamber while making the chamber airtight with a sealing member, the cap inside which a ring-shaped coolant passage is formed near the sealing member; and a plurality of lamp heaters disposed in such a way as to face any one of the plurality of wafers held by the wafer holder, the lamp heaters being disposed so as to extend in the direction of the tangent to the circumference of the cap and align parallel to the direction of the radius of the cap. The distinctive configuration thereof is that, when the plurality of lamp heaters are divided into inner lamps located on the inner side of the cap in the direction of the radius thereof and outer lamps located on the outer side of the cap in the direction of the radius thereof, the amount of heat applied to the wafer per unit time by the outer lamps is made larger than the amount of heat applied to the wafer per unit time by the inner lamps.

A second aspect of the present invention is based on the first aspect, and is directed to a configuration in which the number of lamp heaters of the outer lamps is made equal to the number of lamp heaters of the inner lamps, and all of the outer lamps are energized, and the inner lamps, not all but some of them, are energized, or are not energized at all. A third aspect of the present invention, which is based on the first aspect, is that the number of lamp heaters of the outer lamps is made larger than the number of lamp heaters of the inner lamps. A fourth aspect of the present invention, which is based on the first aspect, is that the lamp heaters are halogen lamps. A fifth aspect of the present invention, which is based on the second aspect, is that the lamp heaters are halogen lamps. A sixth aspect of the present invention, which is based on the third aspect, is that the lamp heaters are halogen lamps.

According to the first aspect of the present invention, although a portion of a wafer into which oxygen ions are implanted, the portion lying close to the side of the chamber is cooled by a coolant passing through the coolant passage for cooling the sealing member, this portion is intensively heated, thereby it is possible to prevent the temperature of this portion from dropping due to the coolant passing through the coolant passage. This helps prevent the development of a nonuniform film thickness in an SOI layer of the wafer, making it possible to produce a SIMOX wafer with good film thickness uniformity.

DETAILED DESCRIPTION OF THE PREFERRED EMBODIMENTS

Preferred embodiments according to the present invention are described with reference to the attached drawings hereinafter.

First Embodiment

Figure 1:
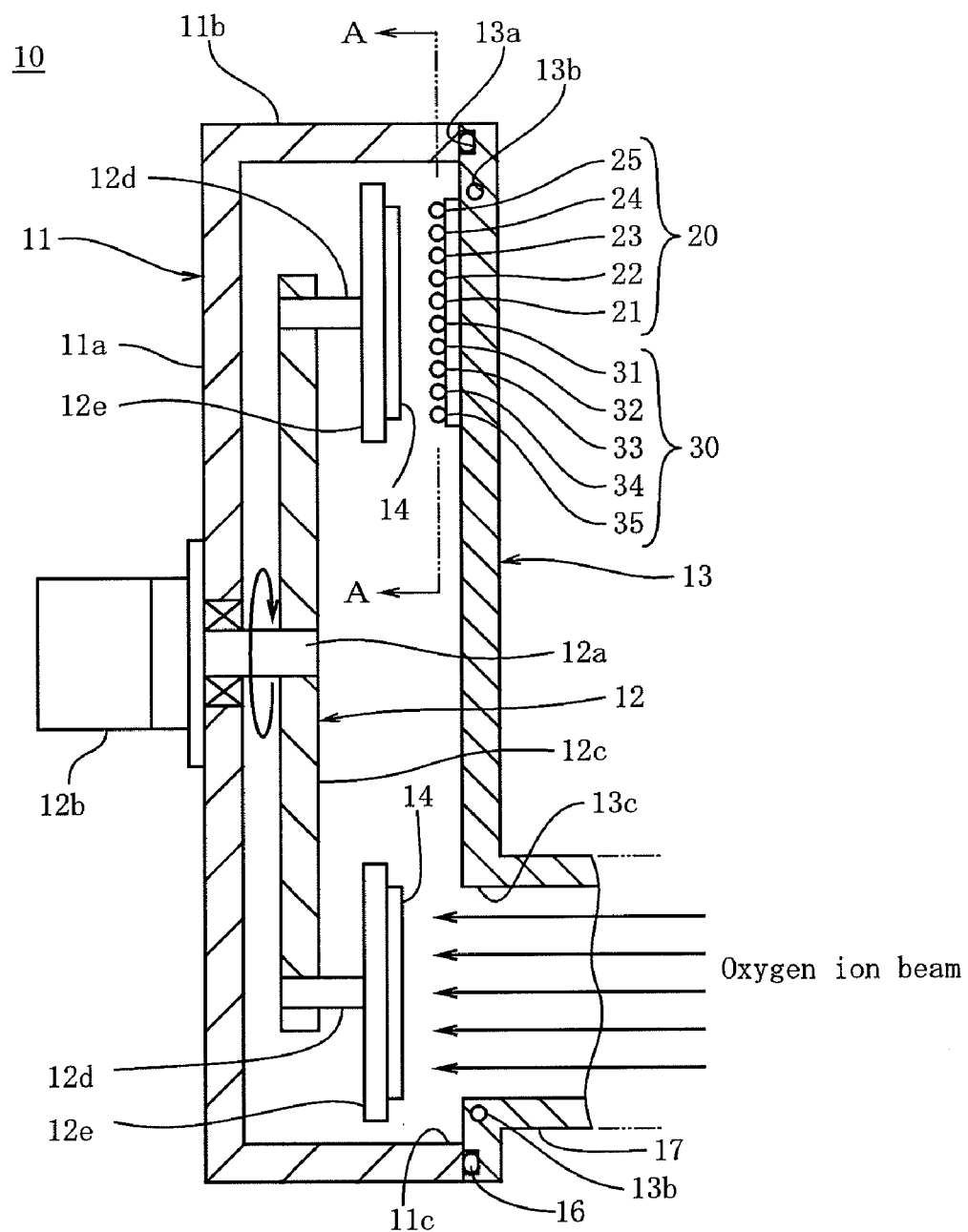
FIG. 1 is a sectional configuration view of oxygen ion implantation equipment according to a first embodiment of the present invention.
Figure 2:
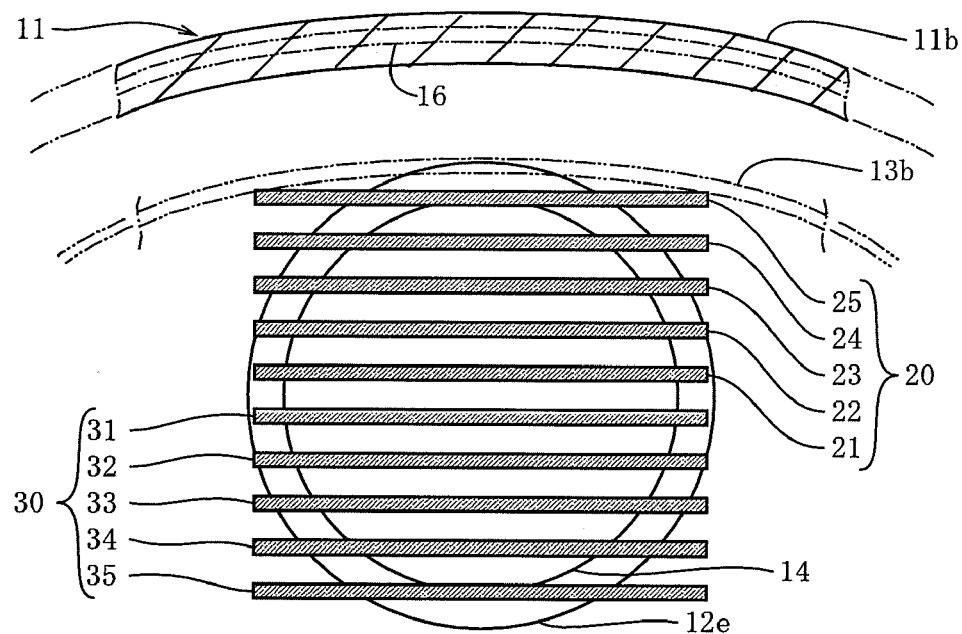
FIG. 2 is a sectional view taken on the line A-A of FIG. 1.

As shown in FIGS. 1 and 2, oxygen ion implantation equipment 10 is provided with a cylindrical chamber 11 which has a bottom wall 11a on one end face thereof and is open in the other end face thereof, a wafer holder 12 housed in the chamber 11, a disk-shaped cap 13 with which an opening 11c of the chamber 11 is closed, and a plurality of lamp heaters 21 to 25 and 31 to 35 disposed in such a way as to face any one of a plurality of wafers 14 held by the wafer holder 12. The wafer holder 12 includes a rotating shaft 12a which is rotatably placed through the center of the bottom wall 11a of the chamber 11, a motor 12b attached to the outer surface of the bottom wall 11a and rotating the rotating shaft 12a, a disk-shaped base 12c which is placed in the chamber 11 and is fixed with the center thereof fitted onto the tip of the rotating shaft 12a, a plurality of fixed shafts 12d vertically provided on the periphery of the base 12c toward the opening 11c of the chamber 11 concentrically and equiangularly around the rotating shaft 12a, and a plurality of wafer supporting plates 12e, each being fitted onto the tip of a corresponding one of the fixed shafts 12d and thereby being fixed. The wafer supporting plates 12e are each formed into the shape of a disk having a diameter lager than the outside diameter of the wafer 14, and the wafer 14 is removably attached to each wafer supporting plate 12e. The outer circumferential border of each wafer 14 is fixed on each wafer supporting plate 12e with three pins (not shown). As the motor 12b rotates the rotating shaft 12a, the base 12c rotates. This rotation of the base 12c makes the plurality of wafers 14 attached to the plurality of wafer supporting plates 12e move around the rotating shaft 12a.

The cap 13 has, on an inner face thereof near the outer circumferential edge thereof, a ring-shaped groove 13a formed so as to face an edge face of a peripheral wall 11b of the chamber 11. Into the groove 13a, an O-ring 16, which is a sealing member, is fitted. When the opening 11c of the chamber 11 is closed with the cap 13, the O-ring 16 makes the chamber 11 airtight (have a predetermined degree of vacuum). Moreover, inside the cap 13, a ring-shaped coolant passage 13b is formed near the O-ring 16 so as to pass a coolant therethrough. The coolant passing through the coolant passage 13b prevents heat from the lamp heaters 21 to 25 and 31 to 35 from transferring to the O-ring 16, making it possible to prevent deterioration of the O-ring 16.

On the other hand, the plurality of lamp heaters 21 to 25 and 31 to 35 are, in this embodiment, ten halogen lamps of the same type. The above-described halogen lamps 21 to 25 and 31 to 35 are disposed so as to extend in the direction of the tangent to the circumference of the cap 13 and align parallel to the direction of the radius of the cap 13. In addition, the plurality of halogen lamps 21 to 25 and 31 to 35 are divided into inner lamps 30 including five halogen lamps 31 to 35 located on the inner side of the cap 13 in the direction of the radius thereof and outer lamps 20 including five halogen lamps 21 to 25 located on the outer side of the cap 13 in the direction of the radius thereof. That is, the inner lamps 30 face a portion of the wafer 14 facing them, the portion (the lower half of the wafer 14 shown in FIG. 2) lying close to the rotating shaft 12a relative to the center of the wafer 14, and are disposed at regular intervals in the direction of the radius of the wafer 14, and the outer lamps 20 face a portion of the wafer 14 facing them, the portion (the upper half of the wafer 14 shown in FIG. 2) lying close to the peripheral wall 11b of the chamber 11 relative to the center of the wafer 14, and are disposed at regular intervals in the direction of the radius of the wafer 14. The amount of heat applied to the wafer 14 per unit time by the outer lamps 20 is made larger than the amount of heat applied to the wafer 14 per unit time by the inner lamps 30. Specifically, the inner lamps 30 are individually controlled by an inner controller (not shown) so as to be turned on/off, and the outer lamps 20 are individually controlled by an outer controller (not shown) so as to be turned on/off. The outer controller energizes all of the outer lamps 20, and the inner controller energizes the inner lamps 30, not all but some of them, or does not energize them at all. Incidentally, reference sign 13c in FIG. 1 denotes a hole formed in the cap 13 so as to face one of the plurality of wafers 14 held by the wafer holder 12. The hole 13c is formed in such a way as to face the wafer 14, which is different from the wafer 14, the halogen lamps 21 to 25 and 31 to 35 face. In addition, reference sign 17 denotes a duct connected to the hole 13c, the duct through which an oxygen ion beam is led to the surface of the wafer 14.

How to use the oxygen ion implantation equipment 10 structured as described above is explained. First, after the wafer 14 is attached to each wafer supporting plate 12e with the opening 11c of the chamber 11 opened, the opening 11c of the chamber 11 is closed with the cap 13. Next, the rotating shaft 12a is rotated by the motor 12b, such that each wafer 14 held on the wafer supporting plate 12e is moved around the rotating shaft 12a. Furthermore, as the coolant is passed through the coolant passage 13b of the cap 13, the energization of the inner lamps 30 is controlled by the inner controller, and the energization of the outer lamps 20 is controlled by the outer controller. For example, all of the five halogen lamps 21 to 25 of the outer lamps 20 are energized, and halogen lamps 32 and 34 of the five halogen lamps 31 to 35 of the inner lamps 30, i.e., two halogen lamps located with one halogen lamp between them, are energized and the other three halogen lamps 31, 33, and 35 are not energized. At this point, of heat generated by the halogen lamps 21 to 25, 32, and 34, heat transferred to the O-ring 16 via the cap 13 is removed by the coolant passing through the coolant passage 13b, whereby the O-ring 16 is not heated to above the upper temperature limit thereof, making it possible to prevent deterioration of the O-ring 16. However, as a result of the coolant passing through the coolant passage 13b, the temperature of a portion of the wafer 14 (an upper portion of the wafer 14 shown in FIG. 2) into which oxygen ions are implanted, the portion lying close to the chamber peripheral wall 11b, tends to become lower than that of a portion of the wafer 14 (a lower portion of the wafer 14 shown in FIG. 2) which lies close to the rotating shaft 12a. To address this problem, by heating the upper half of the wafer 14 with the five halogen lamps 21 to 25 of the outer lamps 20 while heating the lower half of the wafer 14 with the two halogen lamps 32 and 34 of the inner lamps 30, the upper half of the wafer 14 is heated intensively. This makes it possible to prevent the temperature of a portion of the wafer 14, which lies close to the chamber peripheral wall 11b from dropping due to the coolant. As a result, the whole wafer 14 is heated to approximately the same temperature. Therefore, when oxygen ions are implanted into the wafer 14 in this state, an SOI layer of the wafer 14 becomes uniform in film thickness, whereby it is possible to produce a SIMOX wafer 14 with good film thickness uniformity.

Second Embodiment

Figure 3:
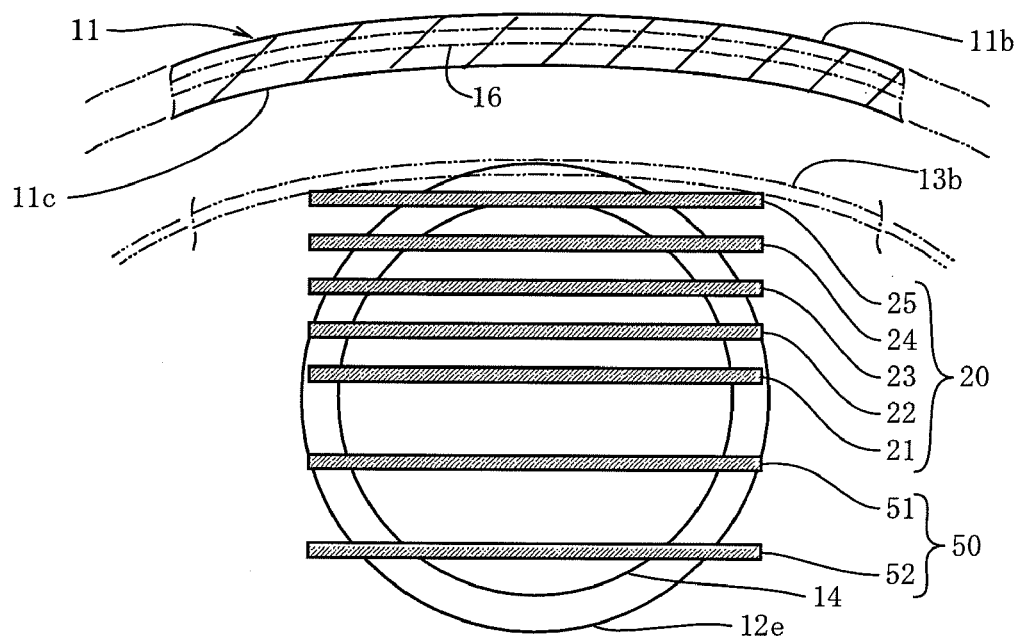
FIG. 3 is a sectional view showing oxygen ion implantation equipment according to a second embodiment of the present invention in the same way as in FIG. 2.

FIG. 3 shows a second embodiment according to the present invention. In FIG. 3, such reference signs as are found also in FIG. 2 denote the same parts. In this embodiment, the number of halogen lamps 21 to 25 of the outer lamps 20 is made larger than the number of halogen lamps 51 and 52 of inner lamps 50. Specifically, the number of halogen lamps 21 to 25 of the outer lamps 20 is five, and the number of halogen lamps 51 and 52 of the inner lamps 50 is two. The five halogen lamps 21 to 25 of the outer lamps 20 face a portion of the wafer 14 facing them, the portion (the upper half of the wafer 14 shown in FIG. 3) lying close to the chamber peripheral wall 11b relative to the center of the wafer 14, and are disposed at regular intervals in the direction of the radius of the wafer 14, and the inner lamps 50 face a portion of the wafer 14 facing them, the portion (the lower half of the wafer 14 shown in FIG. 3) lying close to the rotating shaft relative to the center of the wafer 14, and are disposed at regular intervals in the direction of the radius of the wafer 14. Incidentally, although, in this embodiment, the number of halogen lamps of the inner lamps is two, when the number of halogen lamps of the outer lamps is five, the number of halogen lamps of the inner lamps may be zero, one, three, or four. In other respects, the structure here is the same as in the first embodiment.

In the oxygen ion implantation equipment structured as described above, of the halogen lamps of the inner lamps 50, any halogen lamp which is not energized can be omitted, making it possible to reduce the number of parts and reduce the number of man-hours needed to manufacture the equipment. In other respects, the equipment is used in approximately the same manner as in the first embodiment, and therefore no overlapping explanation will be repeated.

Although, in the first and second embodiments described above, the groove is formed on an inner face of the cap near the outer circumferential edge thereof, it may be formed on an edge face of the peripheral wall of the chamber. In addition, in the first and second embodiments described above, an O-ring is taken as an example of a sealing member; however, the sealing member may be a gasket or packing. Moreover, in the first and second embodiments, ten lamp heaters are used; however, it is also possible to use two to nine lamp heaters or eleven or more lamp heaters. Furthermore, in the first and second embodiments described above, a halogen lamp is taken as an example of a lamp heater; however, the lamp heater may be a carbon lamp, a quartz lamp, or the like.

EXAMPLE

Next, examples according to the present invention are explained in detail together with comparative examples.

Example 1

As shown in FIG. 3, the number of halogen lamps 21 to 25 of the outer lamps 20 was set at five and the number of halogen lamps 51 and 52 of the inner lamps 50 was set at two in order to heat a portion of the wafer 14 into which oxygen ions are implanted, the portion (the upper half of the wafer 14 shown in FIG. 3) lying close to the chamber peripheral wall 11b, more intensively than a portion of the wafer 14 (the lower half of the wafer 14 shown in FIG. 3) which lies close to the rotating shaft. First oxygen ion implantation was performed in such a way that $2.5\times10^{17}$ oxygen ions/cm$^2$ were implanted at an acceleration energy of 220 keV with the silicon wafer 14 heated to 400° C. with the five halogen lamps 21 to 25 of the outer lamps 20 and the two halogen lamps 51 and 52 of the inner lamps 50. Second oxygen ion implantation was performed in such a way that $4.0\times10^{15}$ oxygen ions/cm$^2$ were implanted at an acceleration energy of 200 keV with the wafer 14 heated to 40° C. Then, high-temperature heat treatment was performed with an oxygen/argon gas mixture containing 40% oxygen with the wafer 14 heated to 1300° C. In this way, 624 SIMOX wafers 14 were produced (13 wafers 14 were produced by a single batch process, and this batch process was performed 48 times).

Comparative Example 1

The number of halogen lamps of the outer lamps was set at five and the number of halogen lamps of the inner lamps was set at five in order to apply a uniform amount of heat to the whole surface of the wafer into which oxygen ions were implanted, and 286 SIMOX wafers were produced in a manner similar to Example 1 (13 wafers were produced by a single batch process, and this batch process was performed 22 times).

<Comparative Test 1 and Evaluation>

Figure 4:
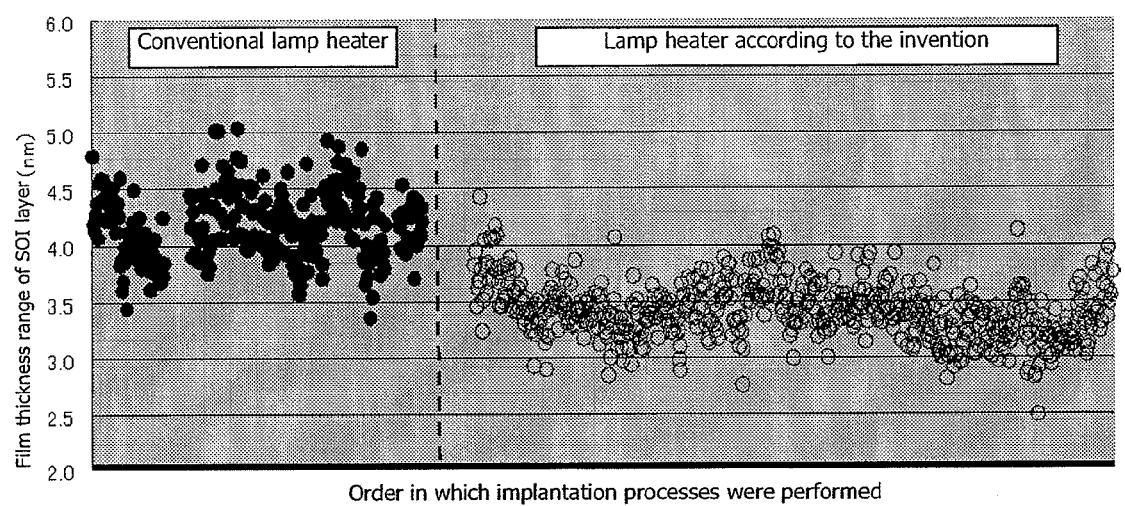
FIG. 4 is a graph of the film thickness range of an SOI layer obtained by a halogen lamp of Example 1 and an SOI layer obtained by a halogen lamp of Comparative Example 1, in the order in which the implantation processes were performed.
Figure 5:
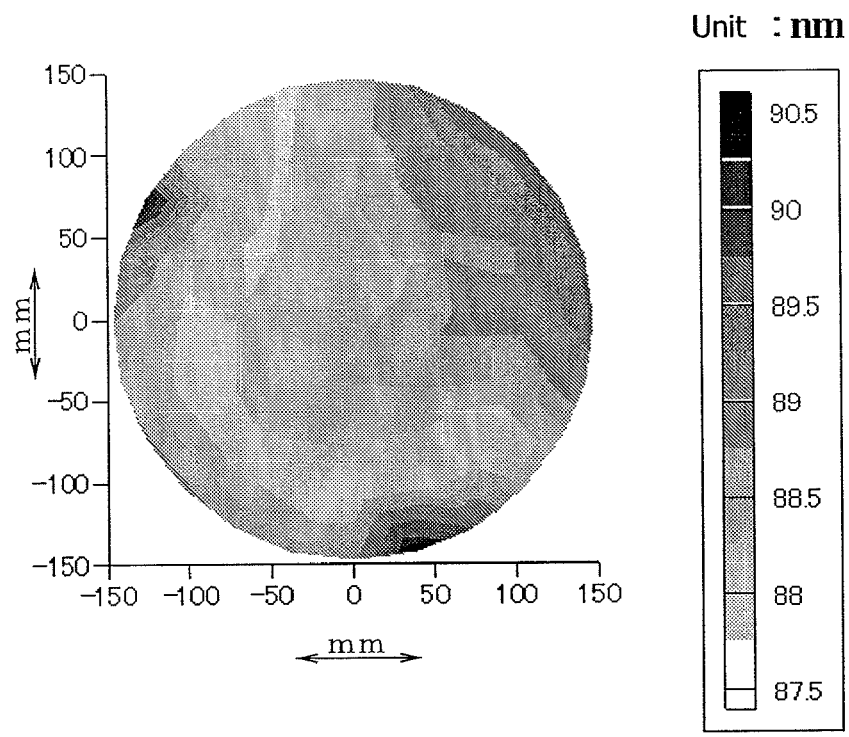
FIG. 5 is a map of the film thickness distribution of an SOI layer obtained by a halogen lamp of Example 1.
Figure 6:
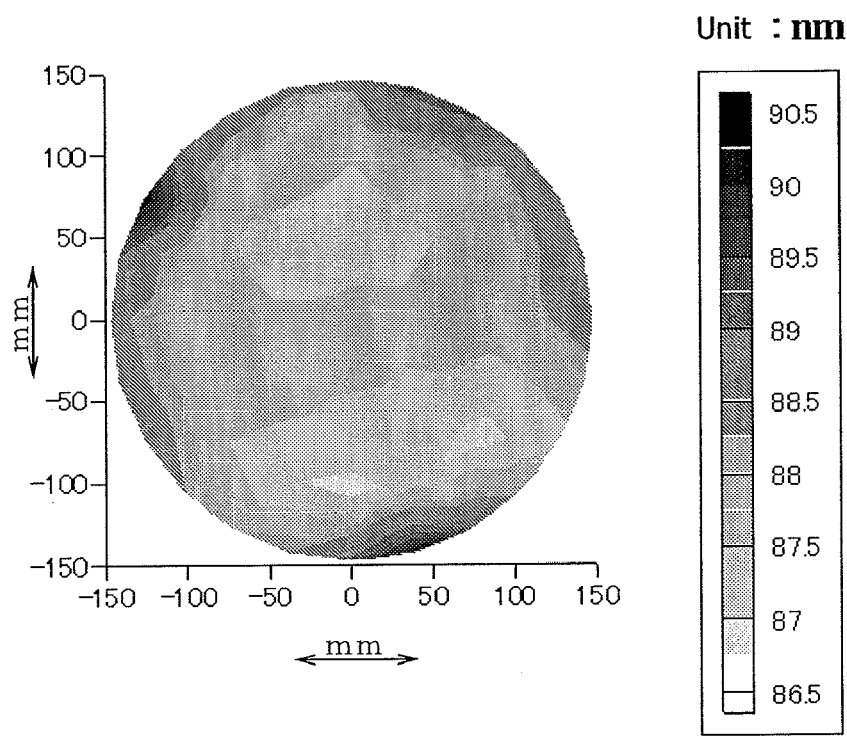
FIG. 6 is a map of the film thickness distribution of an SOI layer obtained by a halogen lamp of Comparative Example 1.

The film thickness uniformity of an SOI layer of each of the 624 SIMOX wafers of Example 1 and the 286 SIMOX wafers of Comparative Example 1 was obtained. Specifically, the thickness of the SOI layer of each wafer was measured at 57 points, and the minimum thickness was subtracted from the maximum thickness to obtain a film thickness range (nm). The results are shown in FIGS. 4, 5, and 6. Incidentally, in FIG. 4, the horizontal axis represents the order in which implantation processes were performed, that is, the far left represents the batch process performed first, and the closer to the far right, the later the batch process. In addition, the left side of FIG. 4 represents Comparative Example 1, and the right side thereof represents Example 1. On the other hand, FIGS. 5 and 6 each show the film thickness range (nm) mapped onto the wafer by using Delta Graph. FIG. 5 represents Example 1, and FIG. 6 represents Comparative Example 1.

As is clear from FIG. 4, while Comparative Example 1 had a wide SOI layer film thickness range of 3.4 to 5.0 nm (an average of 4.2 nm), Example 1 had a narrower SOI layer film thickness range of 2.5 to 4.4 nm (an average of 3.4 nm). Moreover, as is clear from FIG. 6, while in Comparative Example 1 a nonuniform film thickness was obviously found around the perimeter of the wafer (a nonuniform film thickness was developed concentrically in an upper portion of FIG. 6), as is clear from FIG. 5, in Example 1, the film thickness around the perimeter of the wafer became less nonuniform (a concentric nonuniform film thickness was not found in an upper portion of FIG. 5). The results show that the SIMOX wafer of Example 1 achieves a more uniform SOI layer film thickness than the SIMOX wafer of Comparative Example 1. Incidentally, in FIGS. 5 and 6, black portions on the outer circumferential edge of the wafer correspond to portions of the three pins with which the wafer is attached to the wafer supporting plate.

Example 2

Five halogen lamps were disposed in order to heat only a portion of the wafer into which oxygen ions were implanted, the portion lying close to the chamber peripheral wall. Specifically, the number of halogen lamps of the outer lamps was set at five, and the number of halogen lamps of the inner lamps was set at zero. First oxygen ion implantation was performed in such a way that $2.4\times10^{17}$ oxygen ions/cm$^2$ were implanted at an acceleration energy of 200 keV with the silicon wafer heated to 400° C. with the five halogen lamps of the outer lamps. Second oxygen ion implantation was performed in such a way that $2.0\times10^{15}$ oxygen ions/cm$^2$ were implanted at an acceleration energy of 190 keV with the wafer cooled to room temperature. Then, high-temperature heat treatment was performed with an oxygen/argon gas mixture containing 40% oxygen with the wafer heated to 1300° C. In this way, two SIMOX wafers were produced.

Comparative Example 2

The number of halogen lamps of the outer lamps was set at five and the number of halogen lamps of the inner lamps was set at five in order to apply a uniform amount of heat to the whole surface of the wafer into which oxygen ions were implanted, and two SIMOX wafers were produced in a manner similar to Example 2.

<Comparative Test 2 and Evaluation>

The film thickness uniformity of an SOI layer of each of the two SIMOX wafers of Example 2 and the two SIMOX wafers of Comparative Example 2 was obtained. Specifically, the thickness of the SOI layer of each wafer was measured at 57 points, and the minimum thickness was subtracted from the maximum thickness to obtain a film thickness range (nm). As a result, while Comparative Example 2 was found to have a wide SOI layer film thickness range of 3.6 to 3.7 nm, Example 2 was found to have a narrower SOI layer film thickness range of 3.2 to 3.5 nm. The results show that the SIMOX wafer of Example 2 achieves a more uniform SOI layer film thickness than the SIMOX wafer of Comparative Example 2.

What is claimed is:

1. Oxygen ion implantation equipment comprising:
   a cylindrical chamber, which has a bottom wall on one end face thereof and is open in another end face thereof;
   a wafer holder housed in the chamber, the wafer holder rotatably holding a plurality of wafers on a same circumference of a circle;
   a disk-shaped cap closing an opening of the chamber while making the chamber airtight with a sealing member, the cap inside which a ring-shaped coolant passage is formed near the sealing member; and
   a plurality of lamp heaters disposed in such a way as to face any one of the plurality of wafers held by the wafer holder, the lamp heaters being disposed so as to extend in a direction of a tangent to a circumference of the cap and align parallel to a direction of a radius of the cap, wherein
   when the plurality of lamp heaters are divided into inner lamps located on an inner side of the cap in the direction of the radius thereof and outer lamps located on an outer side of the cap in the direction of the radius thereof, an amount of heat applied to the wafer per unit time by the outer lamps is made larger than an amount of heat applied to the wafer per unit time by the inner lamps.

2. Oxygen ion implantation equipment according to claim 1, wherein
   a number of lamp heaters of the outer lamps is made equal to a number of lamp heaters of the inner lamps, and
   all of the outer lamps are energized, and the inner lamps, not all but some of them, are energized, or are not energized at all.

3. Oxygen ion implantation equipment according to claim 2, wherein the lamp heaters are halogen lamps.

4. Oxygen ion implantation equipment according to claim 1, wherein a number of lamp heaters of the outer lamps is made larger than a number of lamp heaters of the inner lamps.

5. Oxygen ion implantation equipment according to claim 4, wherein the lamp heaters are halogen lamps.

6. Oxygen ion implantation equipment according to claim 1, wherein the lamp heaters are halogen lamps.

* * * * *